(12) United States Patent
Wu

(10) Patent No.: US 10,868,061 B2
(45) Date of Patent: Dec. 15, 2020

(54) PACKAGING STRUCTURE FOR A SENSOR HAVING A SEALING LAYER

(71) Applicant: SEMICONDUCTOR COMPONENTS INDUSTRIES, LLC, Phoenix, AZ (US)

(72) Inventor: Weng-Jin Wu, Hsinchu (TW)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/101,567

(22) Filed: Aug. 13, 2018

(65) Prior Publication Data

US 2020/0052020 A1  Feb. 13, 2020

(51) Int. Cl.
*H01L 27/146* (2006.01)
*H01L 31/02* (2006.01)
*H01L 31/0203* (2014.01)

(52) U.S. Cl.
CPC .. *H01L 27/14618* (2013.01); *H01L 27/14632* (2013.01); *H01L 27/14636* (2013.01); *H01L 27/14643* (2013.01); *H01L 27/14687* (2013.01); *H01L 31/0203* (2013.01); *H01L 31/02005* (2013.01)

(58) Field of Classification Search
CPC ......... H01L 27/14618; H01L 27/14632; H01L 27/14636; H01L 27/14643; H01L 27/14687; H01L 31/02005; H01L 31/0203
See application file for complete search history.

(56) References Cited

U.S. PATENT DOCUMENTS

| | | | |
|---|---|---|---|
| 7,105,904 B2 | 9/2006 | Choi | |
| 7,384,818 B2 | 6/2008 | Kim et al. | |
| 8,466,010 B2 | 6/2013 | Tai et al. | |
| 2005/0077458 A1* | 4/2005 | Ma | H04N 5/2257 250/239 |
| 2007/0210437 A1* | 9/2007 | Noma | H01L 21/6836 257/690 |
| 2008/0164550 A1* | 7/2008 | Chen | H01L 27/14683 257/432 |
| 2008/0265441 A1* | 10/2008 | Okada | H01L 27/14683 257/783 |
| 2009/0256260 A1* | 10/2009 | Nakamura | H01L 27/14685 257/758 |

(Continued)

*Primary Examiner* — Fernando L Toledo
*Assistant Examiner* — Aaron J Gray
(74) *Attorney, Agent, or Firm* — Brake Hughes Bellermann LLP

(57) ABSTRACT

According to an aspect, a sensor packaging structure includes a sensor die having a first surface and a second surface opposite the first surface, where the sensor die defines a sensor edge disposed between the first surface and the second surface. The sensor packaging structure includes a bonding material having a first surface and a second surface opposite the second surface, where the bonding material defines a bonding material edge disposed between the first surface of the bonding material and the second surface of the bonding material. The sensor packaging structure includes a transparent material, where the bonding material couples the sensor die to the transparent material. The sealing material is disposed on an interface between the sensor die and the bonding material, and at least one of a portion of the sensor edge or a portion of the bonding material edge.

17 Claims, 10 Drawing Sheets

(56) References Cited

U.S. PATENT DOCUMENTS

| | | |
|---|---|---|
| 2009/0263927 A1 | 10/2009 | Lin et al. |
| 2012/0161308 A1* | 6/2012 | Chu .................. H01L 21/78 |
| | | 257/692 |
| 2014/0191352 A1 | 7/2014 | Wang et al. |
| 2015/0340397 A1* | 11/2015 | Seo .................. H01L 27/14623 |
| | | 257/432 |

* cited by examiner

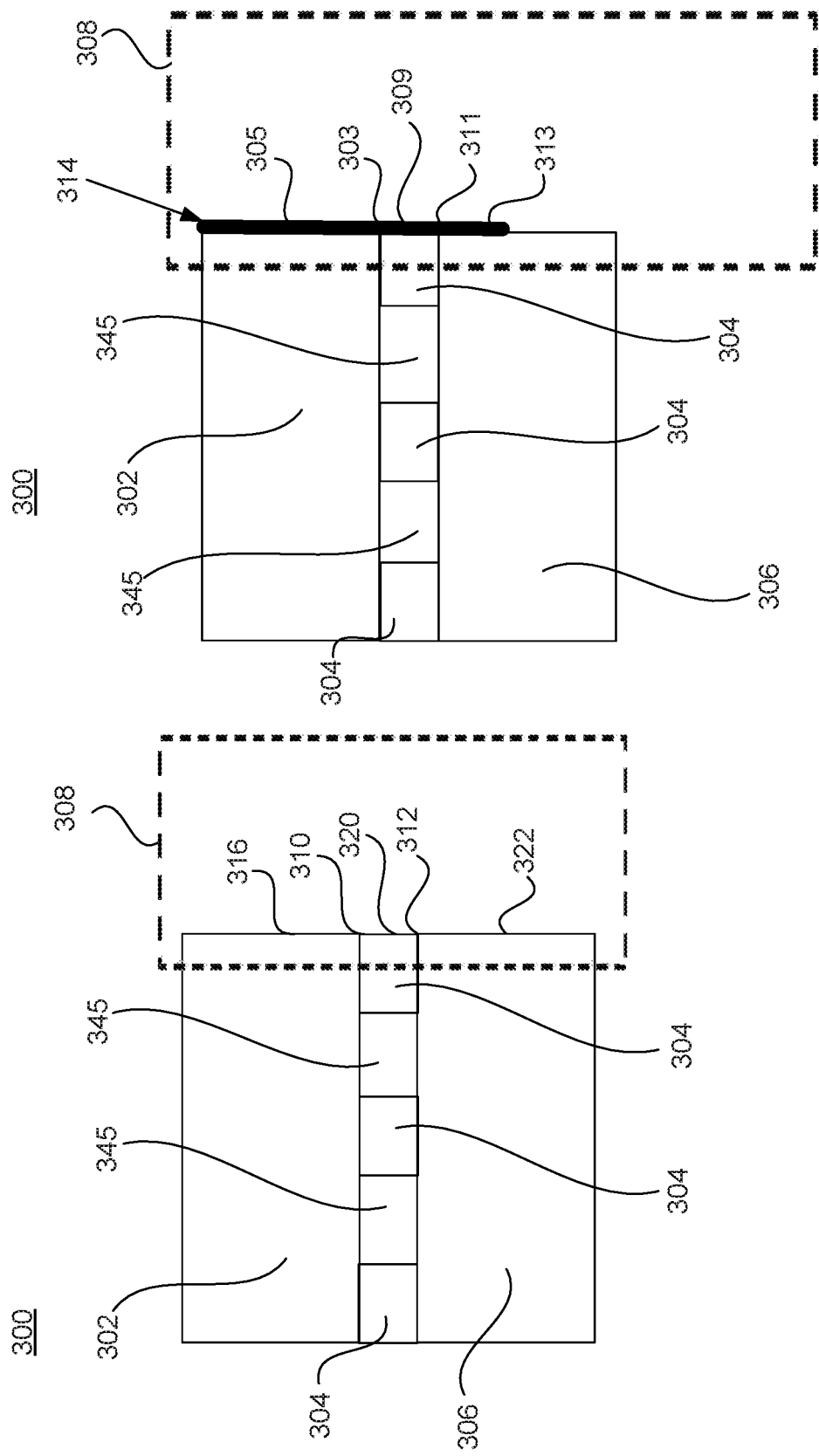

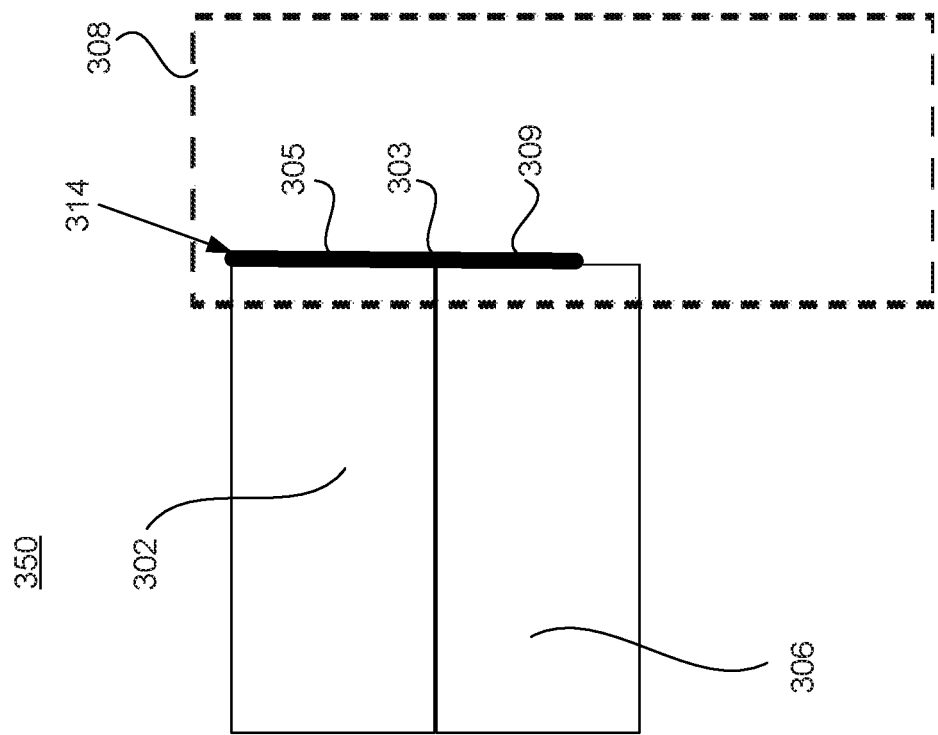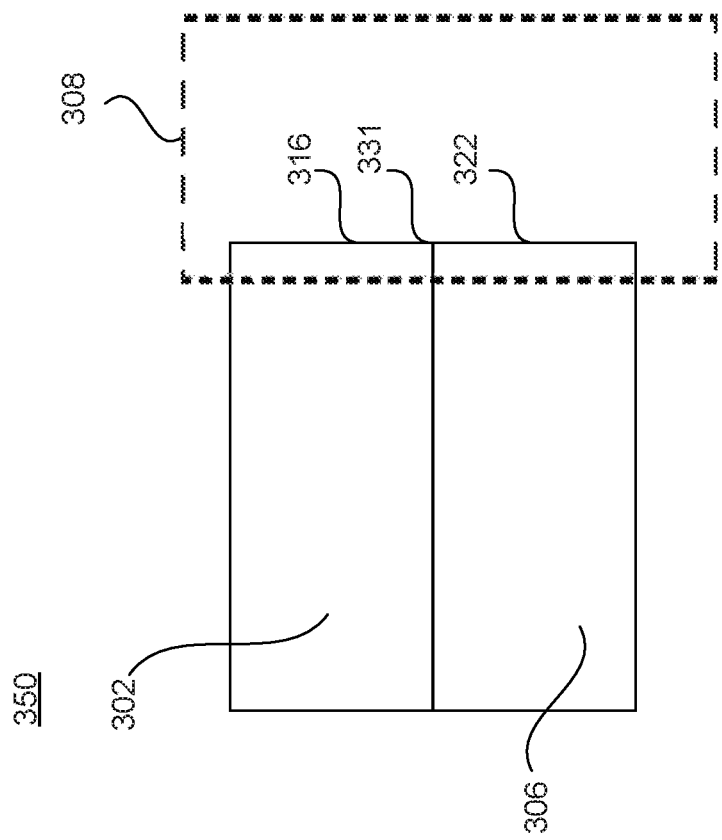
FIG. 3D
FIG. 3C

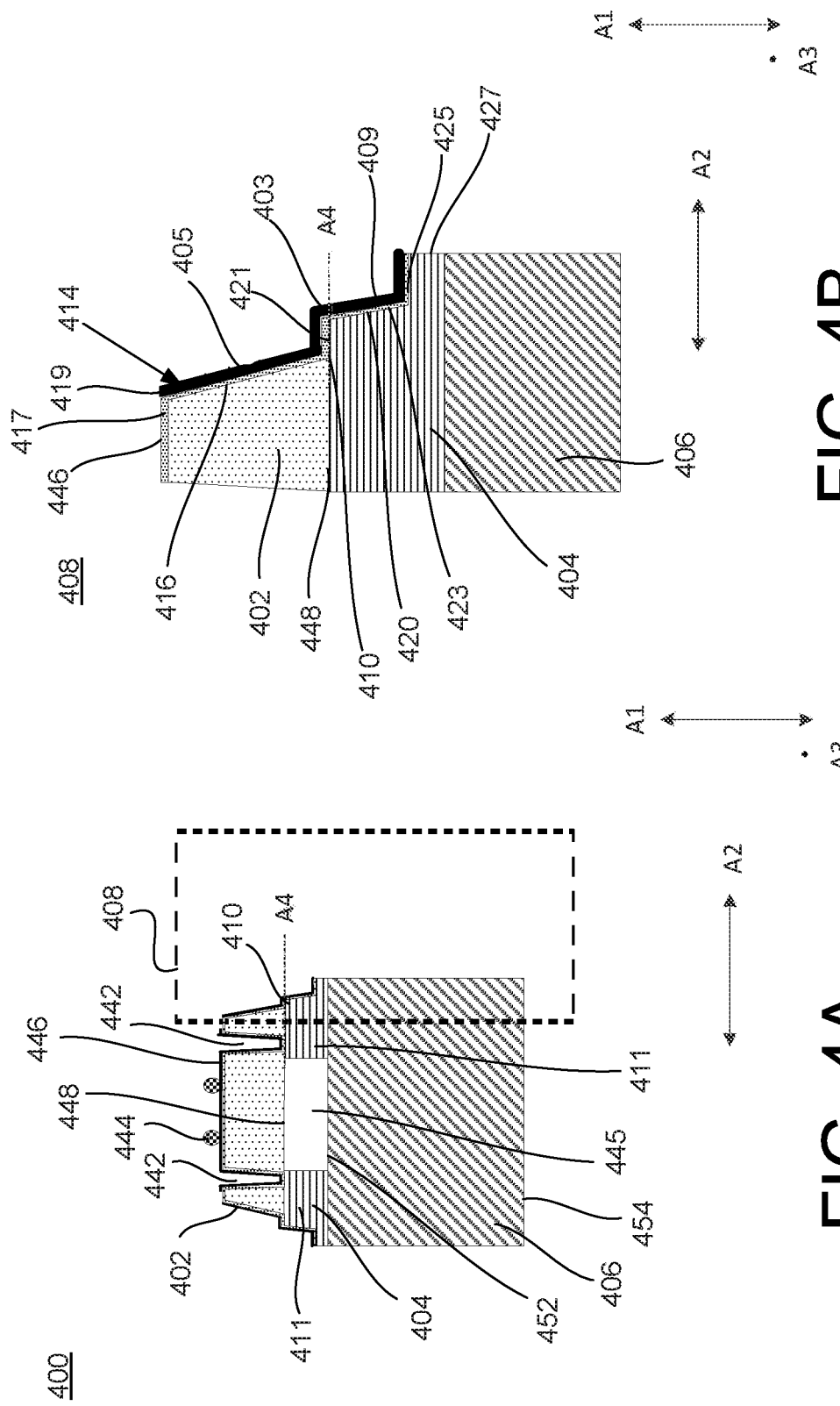

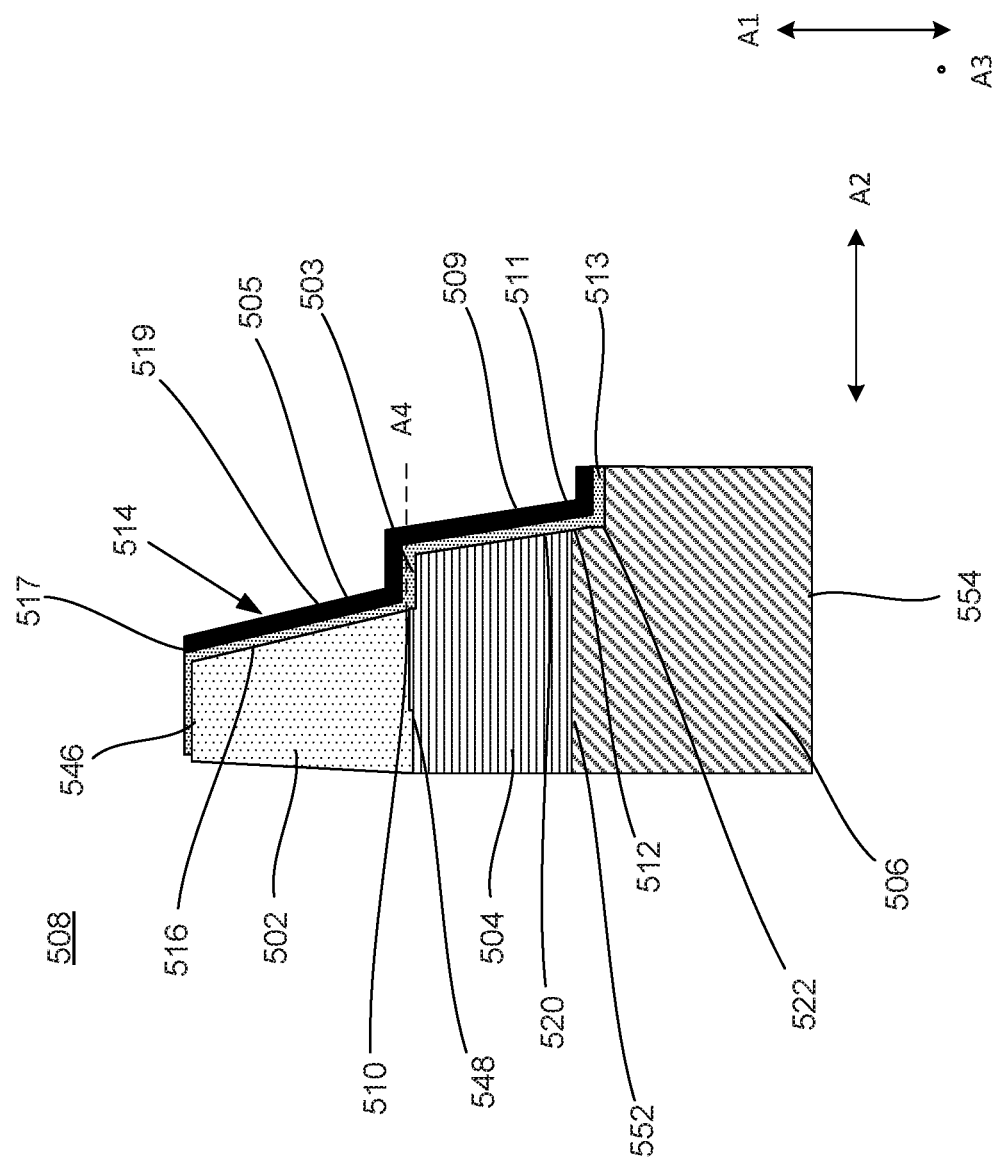

PACKAGING STRUCTURE FOR A SENSOR HAVING A SEALING LAYER

TECHNICAL FIELD

This description relates to a package structure for a sensor having a sealing layer.

BACKGROUND

A sensor packing structure may protect the sensor from moisture. However, in some applications, moisture may still leak through the package and interfere with the operations of the sensor.

SUMMARY

According to an aspect, a sensor packaging structure includes a sensor die having a first surface and a second surface opposite the first surface, where the sensor die defines a sensor edge disposed between the first surface and the second surface. The sensor packaging structure includes a bonding material having a first surface and a second surface opposite the second surface, where the bonding material defines a bonding material edge disposed between the first surface of the bonding material and the second surface of the bonding material. The sensor packaging structure includes a transparent material, where the bonding material couples the sensor die to the transparent material, and a sealing material including one or more layers. The sealing material is disposed on an interface between the sensor die and the bonding material at an edge portion of the sensor packaging structure, and at least one of a portion of the sensor edge or a portion of the bonding material edge.

According to some aspects, the sensor packaging structure may include one or more of the following features or any combination thereof. The sealing material may include a metal layer. The sealing material may include a passivation layer and a metal layer. The transparent material includes a first surface and a second surface, where at least a portion of the second surface of the sensor die contacts the first surface of the bonding material. At least a portion of the sealing material may extend along a portion of the first surface of the sensor die. The sealing material may also be disposed on an interface between the transparent material and the bonding material. The sealing material may extend along the sensor edge, the interface between the sensor die and the bonding material, the bonding material edge, the interface between the bonding material and the transparent material, and a transparent material edge of the transparent material. The sensor die may include one or more vias.

According to an aspect, a sensor packaging structure includes a sensor die having a first surface and a second surface, where the sensor die defines a sensor edge disposed between the first surface and the second surface. The sensor packaging structure includes a transparent material coupled to the sensor die, where the transparent material has a first surface and a second surface, and the transparent material defines a transparent material edge disposed between the first surface and the second surface. The sensor packaging structure includes a sealing material including one or more layers. The sealing material is disposed on an interface between the sensor die and the transparent material at an edge portion of the sensor packaging structure, and at least one of a portion of the transparent material edge or a portion of the sensor edge.

According to some aspects, the sensor packaging structure may include one or more of the above and/or below features (or any combination thereof). The transparent material may include a single layer of transparent material. The transparent material may include a first layer of transparent material and a second layer of transparent material, and the sealing material is disposed on an interface between the sensor die and the first layer of transparent material, and the sealing material is disposed on an interface between the sensor die and the second layer of transparent material. The sensor packaging structure may include a bonding material disposed between the sensor die and the transparent material to couple the sensor die to the transparent material, where the sealing material is disposed on an interface of the sensor die and the bonding material. The sealing material may be disposed on an interface of the bonding material and the transparent material. The sensor die may be directly connected to the transparent material. The sealing material may include a metal layer. The sealing material may include a passivation layer and a metal layer. The passivation layer may include solder mask material. The sensor die may include one or more vias.

According to an aspect, a method for fabricating a sensor packaging structure includes coupling a sensor die to transparent material using a bonding material, processing the sensor die including forming one or more vias through the sensor die, and disposing a sealing material on at least one of a first interface or a second interface, where the first interface is between the sensor die and the bonding material, and the second interface is between the bonding material and the transparent material, the sealing material including a metal layer. In some examples, the disposing the sealing material includes disposing a passivation layer on at least one of the first interface or the second interface, and disposing the metal layer on the passivation layer.

The details of one or more implementations are set forth in the accompanying drawings and the description below. Other features will be apparent from the description and drawings, and from the claims.

BRIEF DESCRIPTION OF THE DRAWINGS

FIG. 3A illustrates a sensor packaging structure according to an aspect.

FIG. 3B illustrates a sensor packaging structure with a sealing material applied on an edge portion of the sensor packaging structure according to an aspect.

FIG. 3C illustrates a sensor packaging structure according to an aspect.

FIG. 3D illustrates a sensor packaging structure with a sealing material applied on an edge portion of the sensor packaging structure according to an aspect.

FIG. 4A illustrates a sensor packaging structure according to an aspect.

FIG. 4B illustrates an edge portion of the sensor packaging structure according to an aspect.

FIG. 5 illustrates an edge portion of a sensor packaging structure according to another aspect.

DETAILED DESCRIPTION

The present disclosure relates to a sensor packaging structure that may include a sensor die, a bonding material, and a transparent member. In some examples, the sensor die includes an image sensor die. The transparent member may be coupled to the sensor die using the bonding material. In some applications, moisture may enter through an interface between the sensor die and the bonding material and/or an interface between the bonding material and the transparent member. However, the sensor packaging structure includes a sealing material that covers the interface between the sensor die and the bonding material and/or the interface between the bonding material and the transparent member at the edge portion of the sensor packaging structure. In some examples, the sealing material includes one or more layers. In some examples, the sealing material includes a metal layer. In some examples, the sealing material includes a passivation layer and a metal layer. In some examples, the sensor packaging structure includes the sensor die and the transparent member. In some examples, the sensor die is coupled directly to the transparent member (e.g., without the bonding material). In some examples, the sealing material may be disposed on an interface between the sensor die and the transparent member at the end portion of the sensor packaging structure. The sensor packaging structure discussed herein may reduce (or eliminate) moisture from interfering from the operations of the sensor.

Figure 1B:
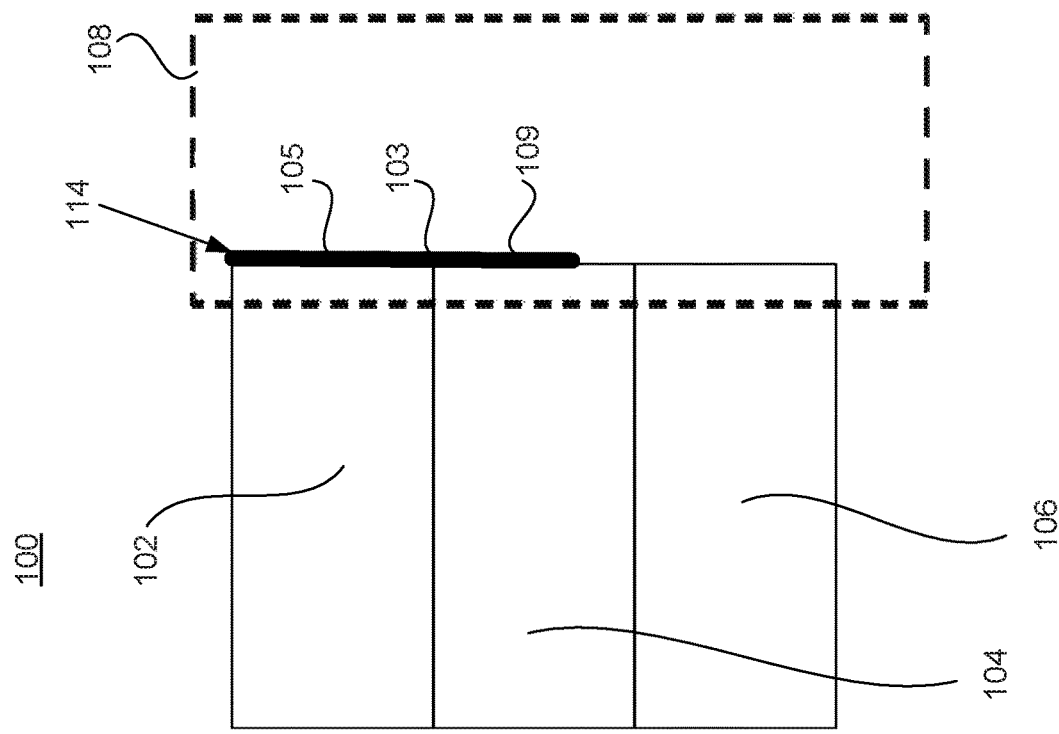
FIG. 1B illustrates a sensor packaging structure with a sealing material applied on an edge portion of the sensor packaging structure according to an aspect.
Figure 1A:
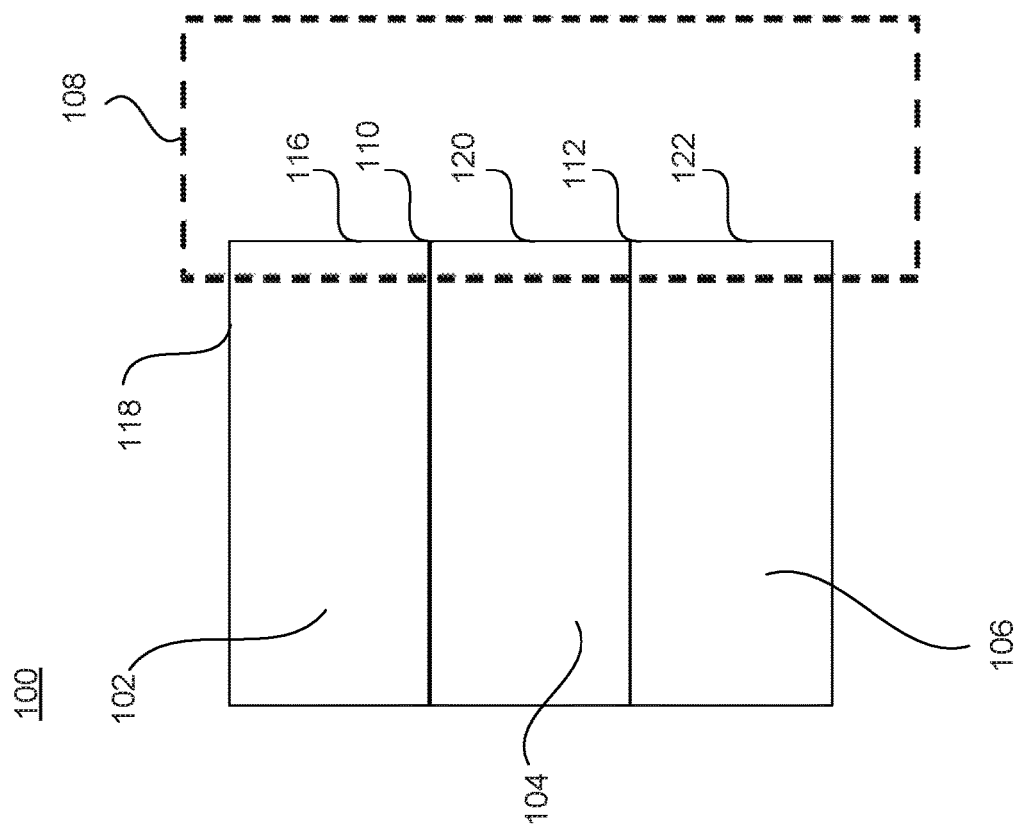
FIG. 1A illustrates a sensor packaging structure according to an aspect.
Figure 1C:
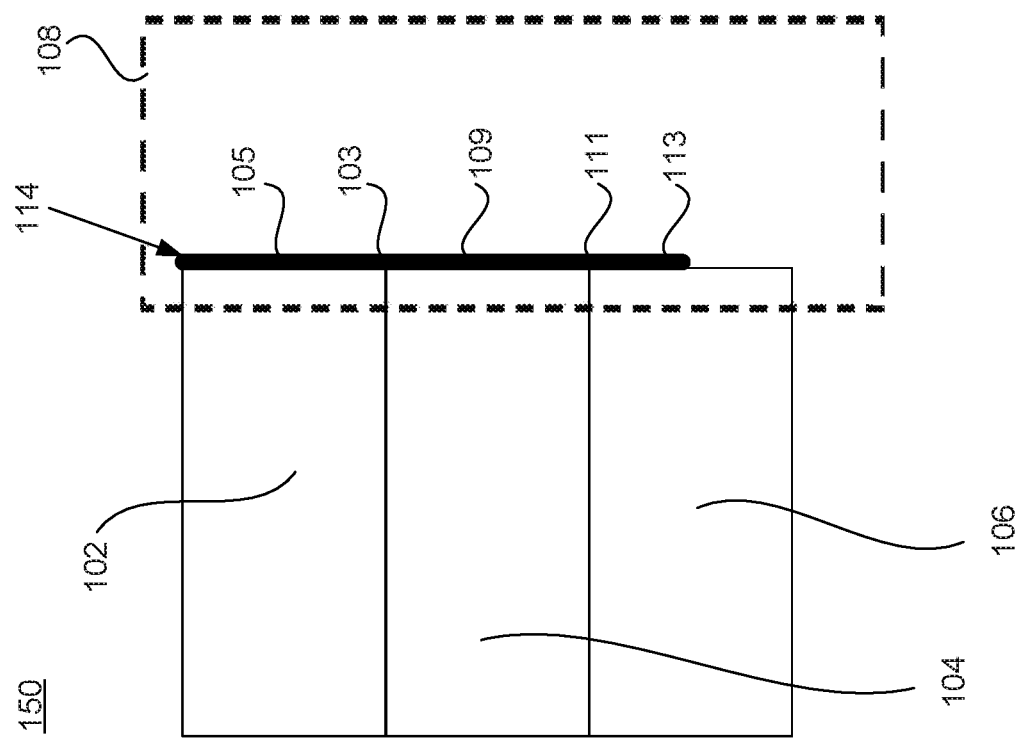
FIG. 1C illustrates a sensor packaging structure with a sealing material applied on an edge portion of the sensor packaging structure according to another aspect.

FIGS. 1A through 1C illustrate sensor packaging structures according to various aspects. FIG. 1A illustrates a sensor packaging structure 100, and FIG. 1B illustrates the sensor packaging structure 100 with a sealing material 114. Referring to FIGS. 1A and 1B, the sensor packaging structure 100 included a sensor die 102, a bonding material 104, and a transparent material 106. The bonding material 104 couples the sensor die 102 to the transparent material 106. In some examples, the sensor packaging structure 100 is a sensor chip scale package. In some examples, the sensor packaging structure 100 is a complementary metal-oxide-semiconductor (CMOS) image sensor chip scale package.

In some examples, the sensor die 102 includes an image sensor die. In some examples, the sensor die 102 is configured to convert electromagnetic radiation (e.g., light) to electrical signals. In some examples, the sensor die 102 includes, or corresponds with, an array of pixels. In some examples, the sensor die 102 includes a CMOS image sensor. In some examples, the bonding material 104 includes an adhesive material. In some examples, the bonding material 104 includes a polymer-based material. In some examples, the bonding material 104 includes an epoxy resin. In some examples, the transparent material 106 includes a material that allows electromagnetic radiation (e.g., light (e.g., visible light)) to pass through (e.g., pass through the entirety of the material). In some examples, the transparent material 106 includes an optically transparent material that allows the transmission of light waves without being scattered (or being scattered to a relatively small or negligible degree). In some examples, the transparent material 106 includes an organic material. In some examples, the transparent material 106 includes an inorganic material. In some examples, the transparent material 106 includes one or more organic materials and/or one or more inorganic materials. In some examples, the transparent material 106 includes a glass material. In some examples, the transparent material 106 include one layer of transparent material or two or more layers of transparent material.

As shown in FIG. 1A, the sensor packaging structure 100 includes an edge portion 108 defining a first interface 110 between the sensor die 102 and the bonding material 104, and a second interface 112 between the bonding material 104 and the transparent material 106. The sensor die 102 has a sensor edge 116, the bonding material 104 has a bonding material edge 120, and the transparent material 106 has a transparent material edge 122.

As shown in FIG. 1B, the sensor packaging structure 100 includes a sealing material 114. The sealing material 114 includes a portion 103 that covers (e.g., disposed on) the first interface 110 at the edge portion 108 of the sensor packaging structure 100. The sealing material 114 may include a portion 105 that is disposed on and extends along at least a portion of the sensor edge 116 of the sensor die 102. The sealing material 114 may include a portion 109 this is disposed on and extends across at least a portion of the bonding material edge 120 of the bonding material 104. In some examples, the sealing material 114 includes a portion that is disposed on at least a portion of a surface 118 of the sensor die 102. The sealing material 114 may help to reduce (or prevent) moisture from entering into the sensor packaging structure 100 by covering the first interface 110 between the sensor die 102 and the bonding material 104 at the edge portion 108 of the sensor packaging structure 100.

In some examples, the sealing material 114 includes a metal layer. The metal layer may include one metal layer or more than one metal layer. The metal layer may include one or more metal layers from aluminum (Al), titanium (Ti), tantalum (Ta), copper (CU), gold (Au), and/or nickel (Ni). In some examples, the sealing material 114 includes a metal layer and a passivation layer. In some examples, the passivation layer includes a solder mask material. In some examples, the passivation layer includes a $SiO_xN_yC_x$ material, where x is greater or equal to 0, and y is greater or equal to 0. In some examples, the passivation layer is disposed on the sensor edge 116, the first interface 110, and the bonding material edge 120, and the metal layer is disposed on the passivation layer.

FIG. 1C illustrates a sensor packaging structure 150 according to another aspect. The sensor packaging structure 150 includes the same components as shown in FIGS. 1A and 1B, but the sealing material 114 extends across the second interface 112. For example, as shown in FIGS. 1A and 1C, the sealing material 114 may have a portion 111 that covers or is disposed on the second interface 112 between the bonding material 104 and the transparent material 106. The sealing material 114 may have a portion 113 that is disposed on and extends along at least a portion of the transparent material edge 122. In some examples, the sealing material 114 is disposed on the entire length of the transparent material edge 122.

Figure 2B:
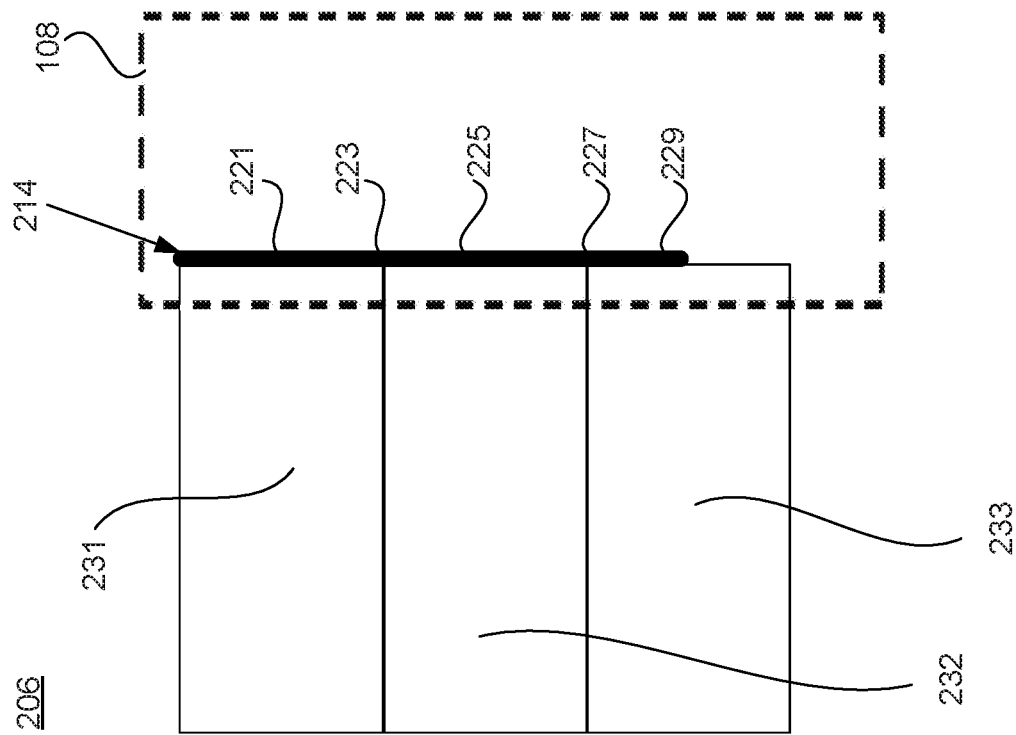
FIG. 2B illustrates a sealing material disposed on an edge of the transparent material according to an aspect.
Figure 2A:
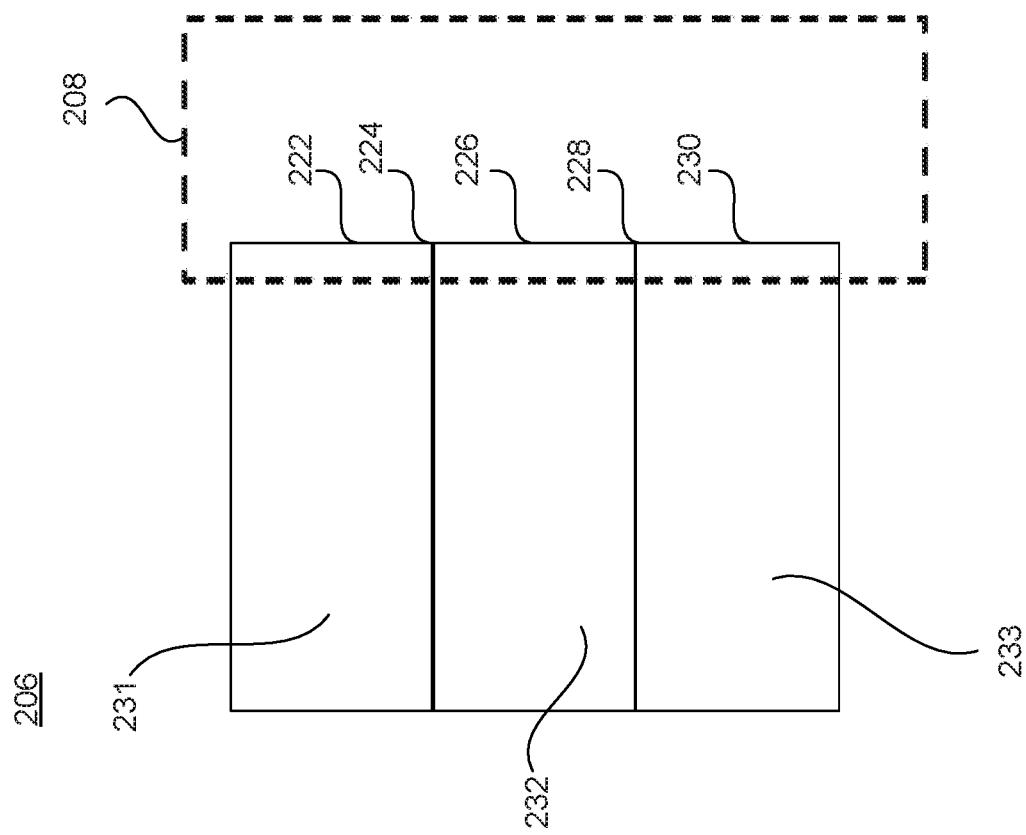
FIG. 2A illustrates an example of a transparent material of a sensor packaging structure according to an aspect.

FIG. 2A illustrates a transparent material 206 with multiple layers, and FIG. 2B illustrates a sealing material 214 disposed across the multiple layers according to an aspect. The transparent material 206 may be an example of the transparent material 106 of FIGS. 1A through 1C. The sealing material 214 may include any of the features discussed with reference to the sealing material 114 of FIGS. 1A through 1C. The transparent material 206 may include a first layer 231, a second layer 232, and a third layer 233. The first layer 231, the second layer 232, and the third layer 233 may include the same transparent material. In some examples, at least one of the first layer 231, the second layer 232, and the third layer 233 includes a transparent material that is different from the other layers. The first layer 231 defines a first edge 222, the second layer 232 defines a second edge 226, and the third layer 233 defines a third edge 230. The transparent material 206 defines a first interface 224 between the first layer 231 and the second layer 232 at an edge portion 208 of the transparent material 206, and a second interface 228 between the second layer 232 and the third layer 233 at the edge portion 208. In some applications, moisture may enter through the first interface 224 and/or the second interface 228.

However, the sealing material 214 is disposed over the interfaces of the transparent material 206 to reduce (or eliminate) moisture from entering into the sensor packaging structure and interfering with operations of the sensor. The sealing material 214 includes a portion 221 disposed on and extending along the first edge 222 of the first layer 231, a portion 223 that is disposed on the first interface 224, a portion 225 disposed on and extending along the second edge 226 of the second layer 232, a portion 227 disposed on the second interface 228, and a portion 229 disposed on and extending along at least a portion of the third edge 230 of the third layer 233. In some examples, the sealing material 214 extends along the entire length of the third edge 230.

FIG. 3A illustrates a sensor packaging structure 300 having a sensor die 302 coupled to a transparent material 306 with a bonding material 304 using a cavity wall design, and FIG. 3B illustrates the sensor packaging structure 300 with a sealing material 314 disposed along an edge portion 308 of the sensor packaging structure 300. As shown in FIGS. 3A and 3B, portions of the bonding material are removed to define gaps 345 between the bonding material 304. The sensor packaging structure 300, the sensor die 302, the transparent material 306, the bonding material 304, and the sealing material 314 may include any one or more of the features explained with reference to FIGS. 1A through 2B. In some examples, the sealing material 314 may be disposed on any of the interfaces between the sensor die 302, the bonding material 304, and the transparent material 306 at the edge portion 308 of the sensor packaging structure 300.

The sensor die 302 may define a sensor edge 316, the bonding material 304 may define a bonding material edge 320, and the transparent material 306 may define a transparent material edge 322. The sensor packaging structure 300 may include a first interface 310 between the sensor die 302 and the bonding material 304, and a second interface 312 between the bonding material 304 and the transparent material 306. The sealing material 314 may include a portion 305 that is disposed on and extends along the sensor edge 316 of the sensor die 302, a portion 303 that is disposed on the first interface 310, a portion 309 that is disposed on and extends along the bonding material edge 320, a portion 311 that is disposed on the second interface 312, and a portion 313 that is disposed on and extends along at least a portion of the transparent material edge 322. In some examples, the sealing material 314 extends along the entire length of the transparent material edge 322. In some examples, the sensor packaging structure 300 includes a gapless design in which the bonding material 304 extends from edge to edge of the sensor packaging structure 300 (e.g., without the gaps 345). In some examples, the sensor packaging structure 100 or the sensor packaging structure 150 includes a gapless design.

FIG. 3C illustrates a sensor packaging structure 350 having a sensor die 302 coupled to a transparent material 306, and FIG. 3D illustrates the sensor packaging structure 350 with a sealing material 314 disposed along an edge portion 308 of the sensor packaging structure 300. The sensor packaging structure 300, the sensor die 302, the transparent material 306, and the sealing material 314 may include any one or more of the features explained with reference to FIGS. 1A through 3B. In some examples, the transparent material 306 is coupled to the sensor die 302 without the use of a bonding material. In some examples, the sealing material 314 may be disposed on any of the interfaces between the sensor die 302 and the transparent material 306.

The sensor die 302 may define a sensor edge 316, and the transparent material 306 may define a transparent material edge 322. The sensor packaging structure 300 may include an interface 331 between the sensor die 302 and the transparent material 306. The sealing material 314 may include a portion 305 that is disposed on and extends along the sensor edge 316 of the sensor die 302, a portion 303 that is disposed on the interface 331, and a portion 309 that is disposed on and extends along at least a portion of the transparent material edge 322. In some examples, the sealing material 314 extends along the entire length of the transparent material edge 322.

FIG. 4A illustrates a sensor packaging structure 400, and FIG. 4B illustrates an edge portion 408 of the sensor packaging structure 400 that includes a sealing material 414 applied on the edge portion 408 according to an aspect.

Referring to FIG. 4A, the sensor packaging structure 400 includes a sensor die 402, a bonding material 404, and a transparent material 406. The sensor die 402 includes a pixel array that is configured to receive light and generate electrical signals based on the received light, and may include any of the characteristics described herein. In some examples, the sensor die 402 includes an image sensor. In some examples, the sensor die 402 includes a CMOS mage sensor. The sensor die 402 includes a first surface 446 and a second surface 448 disposed opposite to the first surface 446. In some examples, the first surface 446 is disposed in parallel with respect to the second surface 448. The distance between the first surface 446 and the second surface 448 may define a thickness of the sensor die 402 in the direction A1. The active region (e.g., where the pixel elements are disposed) may be defined on the second surface 448. The sensor packaging structure 400 may include conductive components 444 coupled to the first surface 446 of the sensor die 402. In some examples, the conductive components 444 are surface-mount packaging elements. In some examples, the conductive components 444 include solder balls. The conductive components 444 are components used to connect to an external device (e.g., a ball grid array (BGA) device). However, the conductive components 444 may include other types of surface-mount packaging elements.

The second surface 448 of the sensor die 402 is disposed in a plane A4. A direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

The sensor die 402 may include one or more vias 442. For example, the vias 442 may extend through the sensor die 402 in a direction A1. For example, the vias 442 may extend through the first surface 446 and the second surface 448 in the direction A1. In some examples, as shown in FIG. 4A, the vias 442 are tapered towards the second surface 448 of the sensor die 402. Each via 442 may be a vertical interconnect access that extends in the A1 direction. Each via 442 may include a hole lined with a conductive material.

The sensor die 402 is coupled to the transparent material 406 using the bonding material 404. For example, the bonding material 404 is disposed between the sensor die 402 and the transparent material 406 at the edge portion 408. In some examples, the bonding material 404 includes a polymer-based adhesive material, and may include any of the characteristics discussed herein. In some examples, an empty space 445 is defined between a portion of the sensor die 402 and a portion of the transparent material 406. In some examples, the bonding material 404 defines a dam member 411 at each edge portion 408 of sensor packaging structure 400. The dam members 411 couple the sensor die 402 to the transparent material 406 in a manner that positions a first surface 452 of the transparent material 406 away from the second surface 448 of the sensor die 402.

The transparent material 406 includes the first surface 452 and a second surface 454 disposed opposite to the first surface 452, and may include any of the characteristics discussed herein. In some examples, the second surface 454 is disposed in parallel with the first surface 452. In some examples, the distance between the first surface 452 and the second surface 454 may define a thickness of the transparent material 406 in the direction A1. In some examples, the transparent material 406 includes an organic material. In some examples, the transparent material 406 includes an inorganic material. In some examples, the transparent material 406 includes one or more organic materials and/or one or more inorganic materials. In some examples, the transparent material 406 includes a glass material. In some examples, the transparent material 406 include one layer of transparent material or two or more layers of transparent material.

At the edge portion 408, as shown in FIG. 4B, the sensor packaging structure 400 defines a first interface 410 between the sensor die 402 and the bonding material 404. In some examples, the first interface 410 is an area where the sensor die 402 contacts the bonding material 404 at the edge portion 408. The sensor die 402 includes a sensor edge 416. The sensor edge 416 may be disposed between and extend from the first surface 446 of the sensor die 402 to the second surface 448 of the sensor die 402 in the direction A1. In some examples, the sensor edge 416 may be disposed at a non-zero angle with respect to the direction A1. In some examples, the sensor edge 416 is disposed in parallel with the direction A1. In some examples, the sensor edge 416 is linear. In some examples, the sensor edge 416 includes one or more bent or curved portions.

The bonding material 404 includes a bonding material edge 420. The bonding material edge 420 may be disposed between a top (or first) surface of the bonding material 404 and a bottom (or second) surface (disposed opposite to the first surface) of the bonding material 404. The first surface of the bonding material 404 may be substantially parallel with the first surface 446 or the second surface 448 of the sensor die 416, and the second surface of the bonding material 404 may be substantially parallel with the first surface 452 of the transparent material 406 or the second surface 454 of the transparent material 406. In some examples, the distance between the first surface of the bonding material 404 and the second surface of the bonding material 404 may define a thickness of the bonding material 404 in the direction A1. In some examples, the bonding material edge 420 may include a first edge portion 423 that extends from the first interface 410 along a portion of the bonding material edge 420. In some examples, the first edge portion 423 is disposed at a non-zero angle with respect to the direction A1. The bonding material edge 420 may include a second edge portion 425 that extends in a direction A2. The bonding material edge 420 may include a third edge portion 427 that extends in the direction A1.

The sealing material 414 includes a passivation layer 417 and a metal layer 419. The metal layer 419 may include one or more metal layers from aluminum (Al), titanium (Ti), tantalum (Ta), copper (CU), gold (Au), and/or nickel (Ni). In some examples, the passivation layer 417 includes a solder mask material. In some examples, the passivation layer 417 includes a $SiO_xN_yC_x$ material, where x is greater or equal to 0, and y is greater or equal to 0. In some examples, the passivation layer 417 also extends along the first surface 446 of the sensor die 402 and the vias 442. In some examples, the metal layer 419 is only applied on the edge portion 408.

The sealing material 414 includes a portion 405 that is disposed on and extends along the sensor edge 416, a portion 403 that is disposed on the first interface 410, and a portion 409 that is disposed on and extends along at least a portion of the bonding material edge 420. In some examples, the portion 405 of the sealing material 414 extends the entire length of the sensor edge 416. In some examples, the portion 405 of the sealing material 414 extends along only a portion of the sensor edge 416. In some examples, the sealing material 414 disposed on a surface portion 421 of the bonding material 404, where the surface portion 421 is disposed in a plane that is parallel to the direction A2. In some examples, the sealing material 414 is disposed on the first edge portion 423 of the bonding material edge 420. In some examples, the sealing material 414 is disposed on the second edge portion 425 of the bonding material edge 420. In some examples, the sealing material 414 is not disposed on the third edge portion 427 of the bonding material edge 420.

FIG. 5 illustrates an edge portion 508 of a sensor packaging structure having a sealing material 514 that is applied on the edge portion 508 according to another aspect. The edge portion 508 may be another example of an edge portion of the sensor packaging structure 400 of FIG. 4A, and may include one or more of the features discussed with reference to FIGS. 4A and 4B.

As shown in FIG. 5, the edge portion 508 includes a sensor die 502 coupled to a transparent material 506 using a bonding material 504. The sensor die 502, the bonding material 504, and the transparent material 506 may include any of the features discussed with reference to the previous figures. The sensor die 502 includes a first surface 546 and a second surface 548, and the transparent material 506 includes a first surface 552 and a second surface 554. The bonding material 504 is disposed between the second surface 548 of the sensor die 502 and the first surface 552 of the transparent material 506. The edge portion 508 includes a first interface 510 disposed between the sensor die 502 and the bonding material 504, and a second interface 512 disposed between the bonding material 504 and the transparent material 506. The sensor die 502 includes a sensor edge 516 disposed between and/or extending between the first surface 546 of the sensor die 502 and the second surface 548 of the sensor die 502. In some examples, the sensor edge 516 is disposed at an angle with respect to the direction A1. In some examples, the sensor edge 516 includes one or more portions that are disposed in parallel with the direction A1. In some examples, the sensor edge 516 is linear. In some examples, the sensor edge 516 includes one or more bent or curved portions.

The bonding material 504 includes a bonding material edge 520 that extends between the first interface 510 and the second interface 512. In some examples, the bonding material edge 520 includes one or more portions that are disposed at a non-zero angle with respect to the direction A1. In some examples, the bonding material edge 520 includes one or more portions that are disposed in parallel with the direction A1. The transparent material 506 includes a transparent material edge 522 that is disposed between and/or extends from the first surface 552 of the transparent material 506 to the second surface 554 of the transparent material 506.

The sealing material 514 may include any of the features explained with reference to the previous figures. For example, the sealing material 514 may include a passivation layer 517 and a metal layer 519. The sealing material 514 may include a portion 505 that is disposed on and extends along the sensor edge 516, a portion 503 that is disposed on the first interface 510, a portion 509 that is disposed on and extends along the bonding material edge 520, a portion 511 that is disposed on the second interface 512, and a portion 513 that extends along a portion of the transparent material edge 522.

Figure 6A:
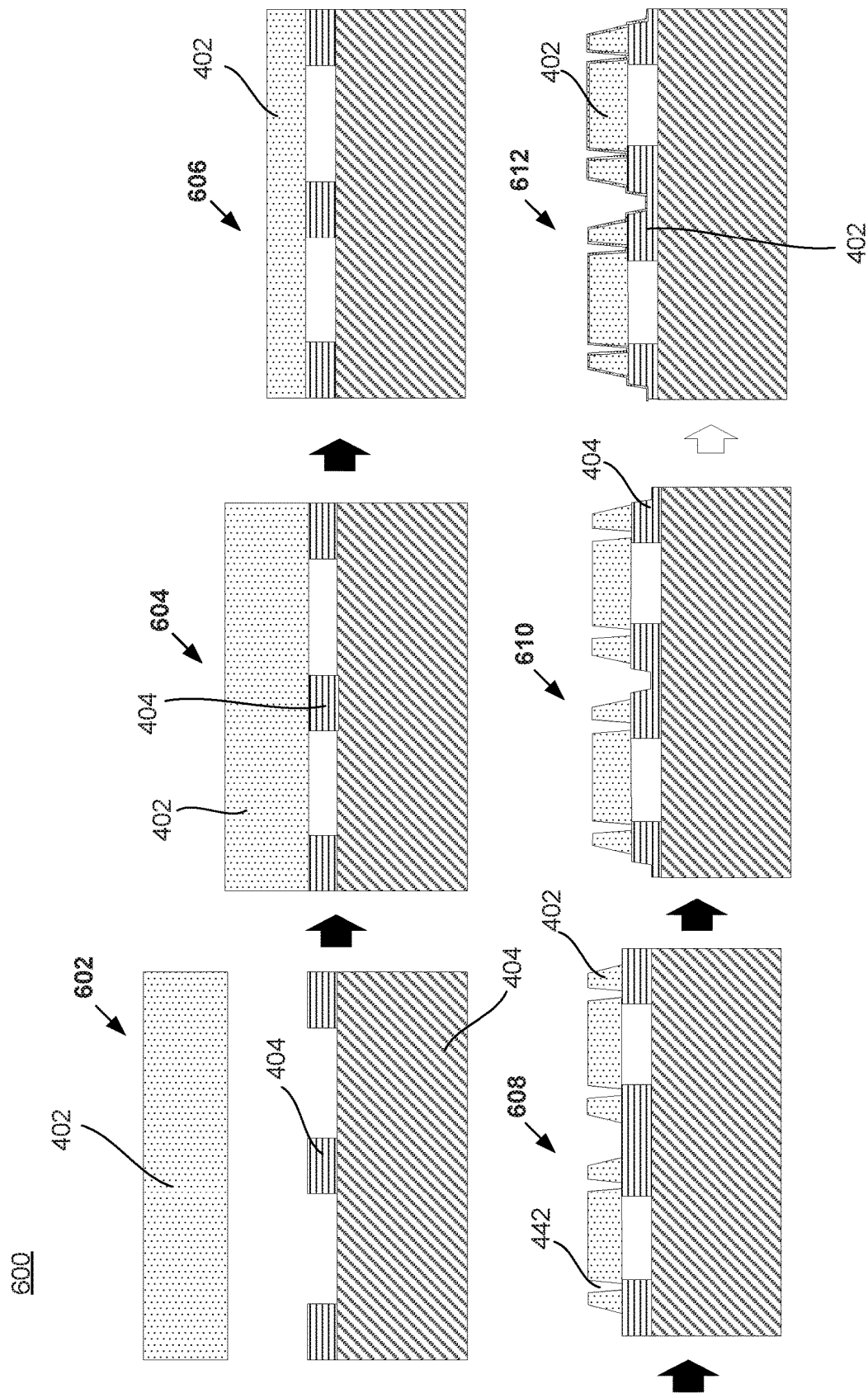
FIG. 6A illustrates a flowchart depicting example fabrication operations for a sensor packaging structure according to an aspect.
Figure 6B:
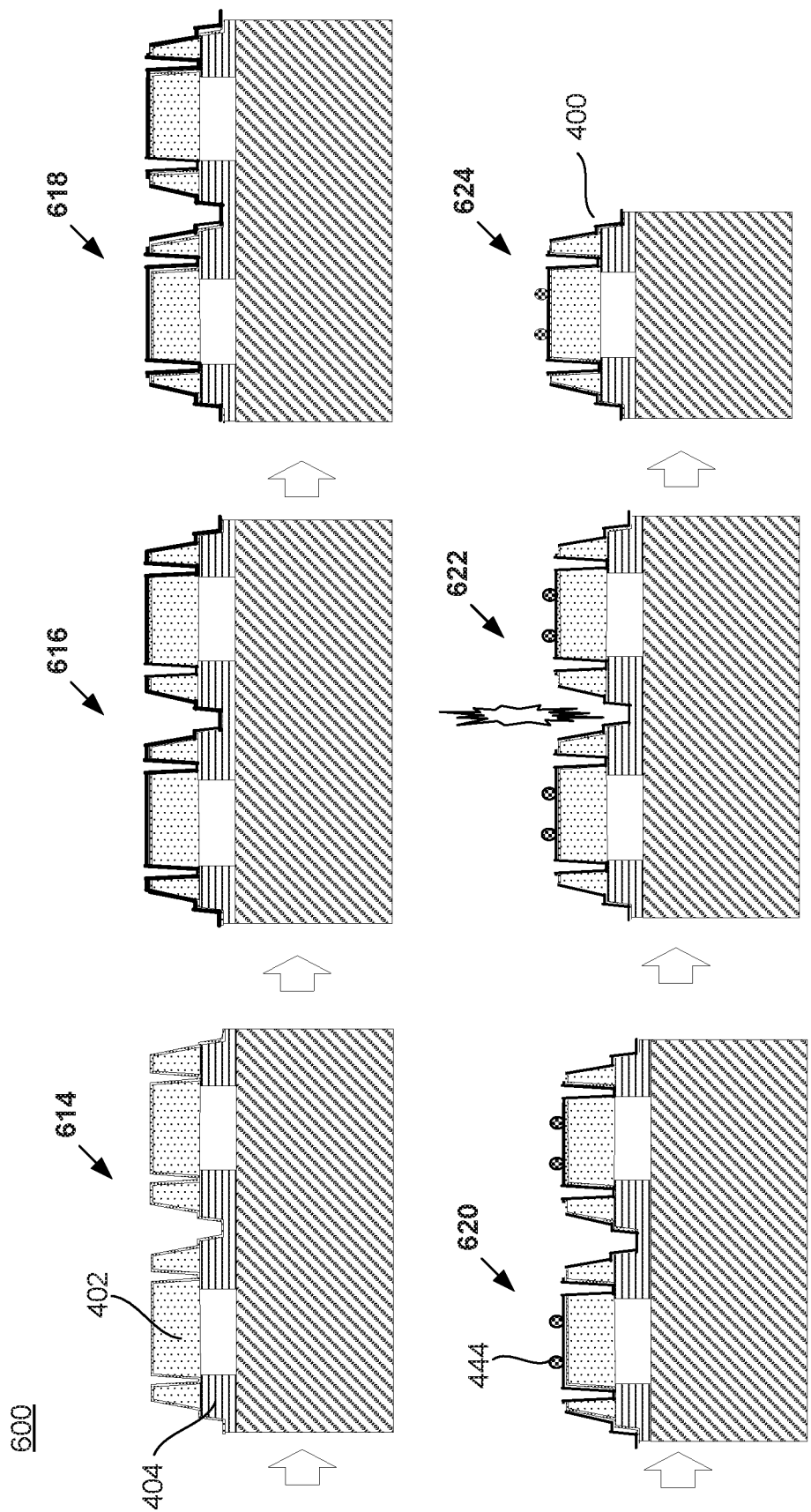
FIG. 6B illustrates a flowchart depicting example fabrication operations for the sensor packaging structure according to an aspect.

FIGS. 6A and 6B illustrate a flowchart 600 depicting example fabrication operations for manufacturing a sensor packaging structure having a sealing material according to an aspect. Although the flowchart 600 is described with reference to the sensor packaging structure 400 of FIGS. 4A and 4B, the flowchart 600 may be applicable to any of the sensor packaging structures discussed herein. Although the flowchart 600 of FIGS. 6A and 6B illustrates operations in sequential order, it will be appreciated that this is merely an example, and that additional or alternative operations may be included. Further, operations of FIGS. 6A and 6B and related operations may be executed in a different order than that shown, or in a parallel or overlapping fashion.

Operation 602 includes providing the sensor die 402 (e.g., a sensor wafer) and the transparent material 406 with the bonding material 404. Operation 604 includes bonding the sensor die 402 to the transparent material 406 using the bonding material 404. Operation 606 includes wafer level thinning on the sensor die 402. Operation 608 includes through via etching to form the vias 442. Operation 610 includes pre-cutting the bonding material 404. Operation 612 including performing passivation on exposed bottom surfaces of the sensor die 402 and the bonding material 404. Operation 614 includes performing passivation open on exposed bottom surfaces of the sensor die 402 and the bonding material 404. Operations 616 and 618 include metal depositing, and operation 620 includes metal patterning that includes coupling the conductive components 444. Operation 622 includes metal patterning to slice the package, and operation 624 includes providing the sensor packaging structure 400.

Figure 7:
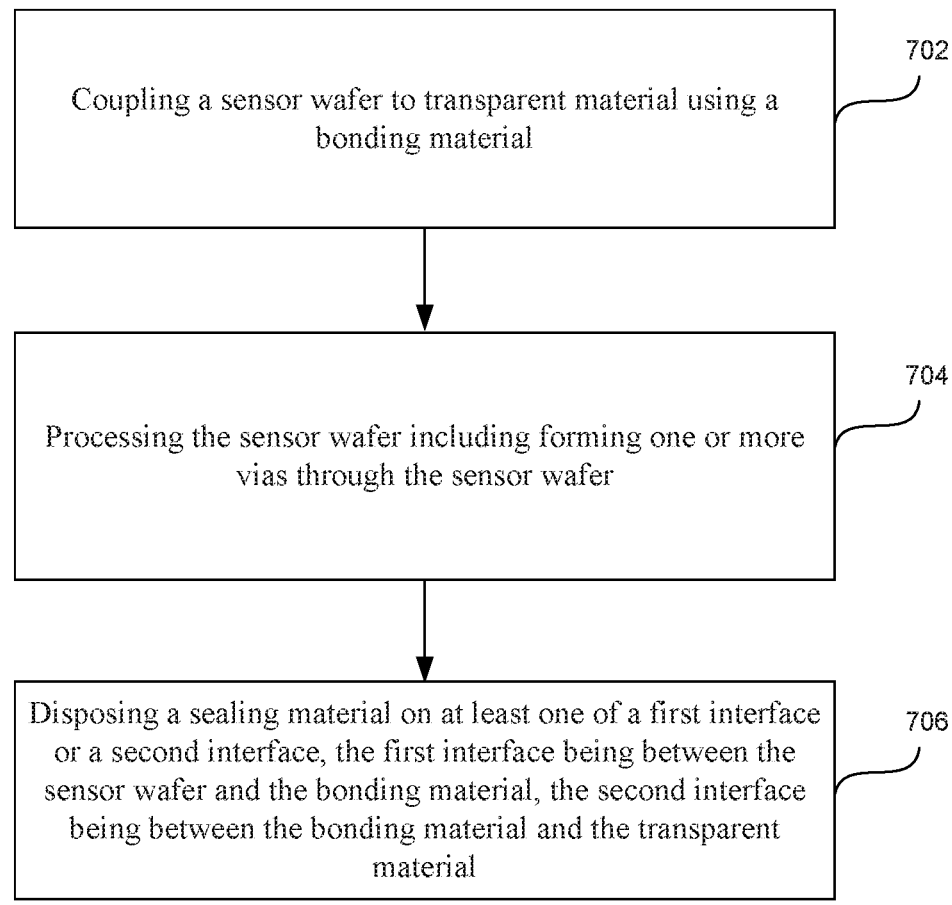
FIG. 7 illustrates a flowchart depicting example fabrication operations for the sensor packaging structure according to an aspect.

FIG. 7 illustrate a flowchart 700 depicting example fabrication operations for manufacturing a sensor packaging structure having a sealing material according to an aspect. The flowchart 700 may be applicable to any of the sensor packaging structures discussed herein. Although the flowchart 700 of FIG. 7 illustrates operations in sequential order, it will be appreciated that this is merely an example, and that additional or alternative operations may be included. Further, operations of FIG. 7 and related operations may be executed in a different order than that shown, or in a parallel or overlapping fashion.

Operation 702 includes coupling a sensor die to transparent material using a bonding material. Operation 704 includes processing the sensor die including forming one or more vias through the sensor die. Operation 706 includes disposing a sealing material on at least one of a first interface or a second interface, where the first interface is between the sensor die and the bonding material, and the second interface is between the bonding material and the transparent material. In some examples, the disposing the sealing material includes disposing a passivation layer on at least one of the first interface or the second interface, and disposing a metal layer on the passivation layer.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or subcombinations of the functions, components and/or features of the different embodiments described.

What is claimed is:

1. A sensor packaging structure comprising:
a substrate having a first surface, a second surface, and a substrate edge that extends between the first surface and the second surface;

a sensor die having a first surface and a second surface opposite the first surface of the sensor die, the sensor die defining a sensor edge that extends between the first surface of the sensor die and the second surface of the sensor die;

a bonding material layer coupling the sensor die to the substrate, the bonding material layer having a first surface and a second surface opposite the first surface of the bonding material layer, the bonding material layer defining a bonding material edge that extends between the first surface of the bonding material layer and the second surface of the bonding material layer; and a sealing material including a passivation layer and a metal layer, the passivation layer including a first portion abutting and covering the sensor edge, a portion of the first surface of the bonding material layer, the bonding material edge, and the substrate edge, the metal layer covering the first portion of the passivation layer, the passivation layer including a portion disposed between the metal layer and the substrate edge.

2. The sensor packaging structure of claim 1, wherein the second surface of the sensor die includes an active region having pixel elements, wherein a plurality of conductive components are coupled to the first surface of the sensor die, wherein a second portion of the passivation layer is coupled to the first surface of the sensor die, wherein the metal layer is not coupled to the second portion of the passivation layer that extends along the first surface of the sensor die.

3. The sensor packaging structure of claim 1, wherein a portion of the substrate edge is tapered.

4. The sensor packaging structure of claim 1, wherein the second surface of the bonding material layer contacts the first surface of the substrate.

5. The sensor packaging structure of claim 1, wherein a distance between the first surface of the substrate and the second surface of the substrate defines a thickness of the substrate, the substrate being a transparent substrate configured to permit passage of light.

6. The sensor packaging structure of claim 1, wherein the first surface of the substrate includes a recessed portion, the passivation layer including a first linear portion coupled to the recessed portion and a second linear portion coupled to the substrate edge, the first linear portion being disposed at a non-zero angle with respect to the second linear portion.

7. The sensor packaging structure of claim 1, wherein the sensor die includes one or more tapered vias.

8. A sensor packaging structure comprising:
a sensor die having a first surface and a second surface, the sensor die defining a sensor edge disposed between the first surface and the second surface;

a substrate coupled to the sensor die, the substrate having a first surface and a second surface, wherein a distance between the first surface of the substrate and the second surface of the substrate defines a thickness of the substrate, the substrate defining a substrate edge between the first surface of the substrate and the second surface of the substrate, the substrate edge including a tapered portion;

a bonding material layer disposed between the sensor die and the substrate to couple the sensor die to the substrate, the bonding material layer defining a bonding material edge disposed between a first surface of the bonding material layer and a second surface of the bonding material layer; and a sealing material including a passivation layer and a metal layer, a first portion of the passivation layer abutting and covering the sensor edge, a portion of the first surface of the bonding material layer, the bonding material edge, and the tapered portion of the substrate edge, the metal layer covering the first portion of the passivation layer, the passivation layer including a portion disposed between the metal layer and the tapered portion of the substrate edge.

9. The sensor packaging structure of claim 8, wherein the sensor edge is tapered.

10. The sensor packaging structure of claim 8, wherein the substrate is a glass substrate.

11. The sensor packaging structure of claim 8, wherein the metal layer covers the passivation layer along the substrate edge, the sensor die edge, and the bonding material edge, wherein the passivation layer is not covered by the metal layer at the first surface of the sensor die.

12. The sensor packaging structure of claim 8, wherein the passivation layer is coupled to a portion of the first surface of the sensor die.

13. The sensor packaging structure of claim 8, wherein the second surface of the sensor die includes an active region having pixel elements, wherein the passivation layer extends along a portion of the first surface of the sensor die, and the metal layer is not coupled to a portion of the passivation layer that extends along the portion of the first surface of the sensor die.

14. The sensor packaging structure of claim 8, wherein the passivation layer includes solder mask material that is different from a material of the metal layer.

15. The sensor packaging structure of claim 8, wherein the sensor die includes a plurality of tapered vias such that a width of each tapered via decreases in a direction toward the second surface of the sensor die.

16. A sensor packaging structure comprising:
a glass substrate having a first surface and a second surface opposite to the first surface, the glass substrate defining a substrate edge extending between the first surface of the glass substrate and the second surface of the glass substrate, wherein a distance between the first surface of the glass substrate and the second surface of the glass substrate defines a thickness of the transparent substrate, the substrate edge including a tapered portion;

an image sensor die having a first surface and a second surface opposite the first surface of the image sensor die, the sensor die defining a sensor edge disposed between the first surface of the image sensor die and the second surface of the image sensor die, the second surface of the image sensor die including an active area, the active area of the image sensor die configured to receive light through the glass substrate;

a plurality of conductive components coupled to the first surface of the image sensor die, the plurality of conductive components configured to connect to an external device;

a bonding material layer coupling the image sensor die to the glass substrate, the bonding material layer having a first surface and a second surface opposite the second surface of the bonding material layer, the bonding material layer defining a bonding material edge disposed between the first surface of the bonding material layer and the second surface of the bonding material layer, the first surface of the bonding material layer being coupled to the second surface of the image sensor die, the second surface of the bonding material layer being coupled to the first surface of the glass substrate; and a sealing material including a passivation layer and a metal layer, the passivation layer abutting and covering the sensor edge, a portion of the first surface of the bonding material layer, the bonding material edge, the tapered portion of the substrate edge, and a portion of the first surface of the image sensor die, the metal layer covering portions of the passivation layer that extend along the sensor edge, the portion of the first surface of the bonding material layer, the bonding material edge, and the tapered portion of the substrate edge, the metal layer not covering the portion of the passivation layer that extends along the portion of the first surface of the image sensor die.

17. The sensor packaging structure of claim 16, wherein the sensor die includes a tapered via such that a width of the tapered via decreases in a direction toward the second surface of the sensor die.

* * * * *